US008692694B2

(12) United States Patent
O'Neill et al.

(10) Patent No.: US 8,692,694 B2
(45) Date of Patent: Apr. 8, 2014

(54) METHOD TO DETECT AND RECOVER FROM STUCK KEYS ON AN ELECTRONIC DEVICE KEYBOARD

(75) Inventors: Conor O'Neill, Waterloo (CA); Christopher James Grant, Waterloo (CA)

(73) Assignee: BlackBerry Limited, Waterloo (CA)

(*) Notice: Subject to any disclaimer, the term of this patent is extended or adjusted under 35 U.S.C. 154(b) by 1322 days.

(21) Appl. No.: 12/491,468

(22) Filed: Jun. 25, 2009

(65) Prior Publication Data

US 2010/0328111 A1   Dec. 30, 2010

(51) Int. Cl.
*H03K 17/00* (2006.01)
*H03M 11/00* (2006.01)
*G06F 3/02* (2006.01)
*G09G 5/00* (2006.01)
*H03M 11/02* (2006.01)

(52) U.S. Cl.
CPC .................................... *H03M 11/02* (2013.01)
USPC ................................. 341/24; 341/26; 345/168

(58) Field of Classification Search
USPC ............... 341/22–29; 345/168; 379/368–370; 200/5 R, 5 A; 708/136; 340/11.1; 380/52
See application file for complete search history.

(56) References Cited

U.S. PATENT DOCUMENTS

| 6,014,131 A | 1/2000 | Barry et al. |
| 6,072,472 A * | 6/2000 | Shiga .......................... 345/168 |
| 2004/0246239 A1 | 12/2004 | Knowles et al. |
| 2006/0049965 A1* | 3/2006 | Laliberte et al. ................ 341/24 |
| 2008/0024326 A1 | 1/2008 | DiFatta et al. |

FOREIGN PATENT DOCUMENTS

EP    0709972 A    5/1996

OTHER PUBLICATIONS

Low-power keypad consumes only 100 nA; http://www.edn.com/index.asp?layout=articlePrint&articleID=CA191162; retrieved Sep. 29, 2009.
PassMark KeyboardTest (TM) allows users to quickly check that all the keys on their computer keyboard are functioning correctly; http://www.passmark.com/products/keytest.htm; retrieved Sep. 29, 2009.
Keyboard key stuck; http://www.pcguide.com/ts/x/sys/booter-rGBER34-c.html; retrieved Sep. 29, 2009.
Hyder, Kamal, and Bob Perrin; Embedded Systems Design using the Rabbit 3000 Microprocessor; Elsevier Inc.; 2005.

(Continued)

*Primary Examiner* — Mohammad Ghayour
*Assistant Examiner* — Jerold Murphy
(74) *Attorney, Agent, or Firm* — Novak Druce Connolly Bove + Quigg LLP

(57) ABSTRACT

A method of detecting and recovering from stuck keys on an electronic device keyboard comprises receiving one or more messages by a processor based upon a predetermined periodic scan rate and each message corresponding to a pressed key, determining one of the pressed keys is a stuck key based upon the received one or more messages corresponding to a pressed key, sending a mock key-up message from the processor to a keyboard controller in response to the determined stuck key, operating the keyboard controller at a changed scan rate in response to the mock key-up message, detecting the electronic device keyboard is in a released key state by the processor; and operating the keyboard controller at the predetermined periodic scan rate in response to the detected released key state. The processor can include two components, such as a keyboard processor and a keyboard controller.

16 Claims, 7 Drawing Sheets

(56) References Cited

OTHER PUBLICATIONS

Extended European Search Report mailed Sep. 3, 2009. In corresponding application No. 09163804.9.

Examination Report mailed Nov. 13, 2009. In corresponding application No. 09163804.9.

Office Action mailed Apr. 5, 2013, in corresponding Canadian patent application No. 2,707,896.

* cited by examiner

METHOD TO DETECT AND RECOVER FROM STUCK KEYS ON AN ELECTRONIC DEVICE KEYBOARD

FIELD OF TECHNOLOGY

The present disclosure relates generally to keyboards. More specifically, the present disclosure relates to methods for detecting and recovering from stuck keys on an electronic device keyboard.

BACKGROUND

With the advent of more robust electronic systems, advancements of electronic devices are becoming more prevalent. Electronic devices can provide a variety of functions including, for example, telephonic, electronic messaging and other personal information manager (PIM) application functions. Handheld electronic devices can include mobile stations such as cellular telephones, smart telephones, PDAs, laptop computers, and desktop computers.

Such electronic devices allow the user to enter data for text messages, email messages, address books, calendars, task lists, word processing documents, and other similar text files. However, the keys of the keyboard can become stuck. For example, if the device is stored in the pocket of a user or in the purse or handbag of the user, the keys of the keyboard can become stuck. When this happens, the stuck keys can continue to send inputs to the processor for dialing numbers, typing letters in a text message or email, or initializing other applications or functions associated with the stuck key, thereby wasting processor resources. When a key is stuck, other keys of the keyboard may not be available for actuation. Consequently, battery power is consumed due to the key being stuck because the device is continuously and constantly scanning the keyboard for pressed keys and inputting messages corresponding to the pressed keys. Typically, the device cannot enter a sleep mode or lower power mode because the key is stuck and continuously sending messages corresponding to pressed keys to the processor of the device. For example, because the pressed key is continuously sending messages to the processor, the device can continue sending power to the display screen which consumes the battery power of a handheld electronic device.

BRIEF DESCRIPTION OF THE DRAWINGS

Embodiments of the present application will now be described, by way of example only, with reference to the attached Figures, wherein.

DETAILED DESCRIPTION

Figure 1:
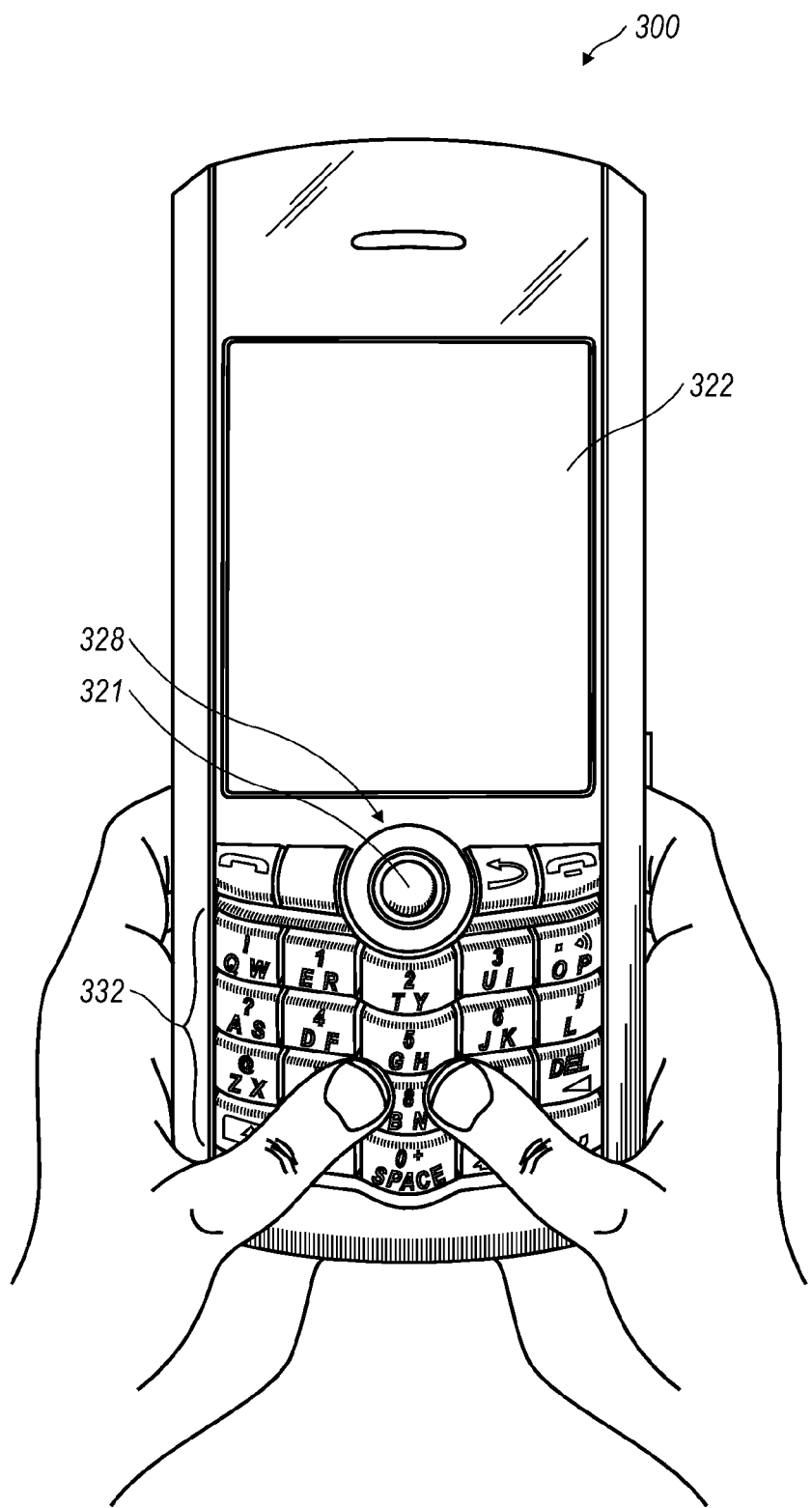
FIG. 1 is an exemplary device having a depressible keyboard on which the method for detecting and recovering from stuck keys on an electronic device keyboard can be implemented in accordance with an exemplary embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein.

Figure 7:
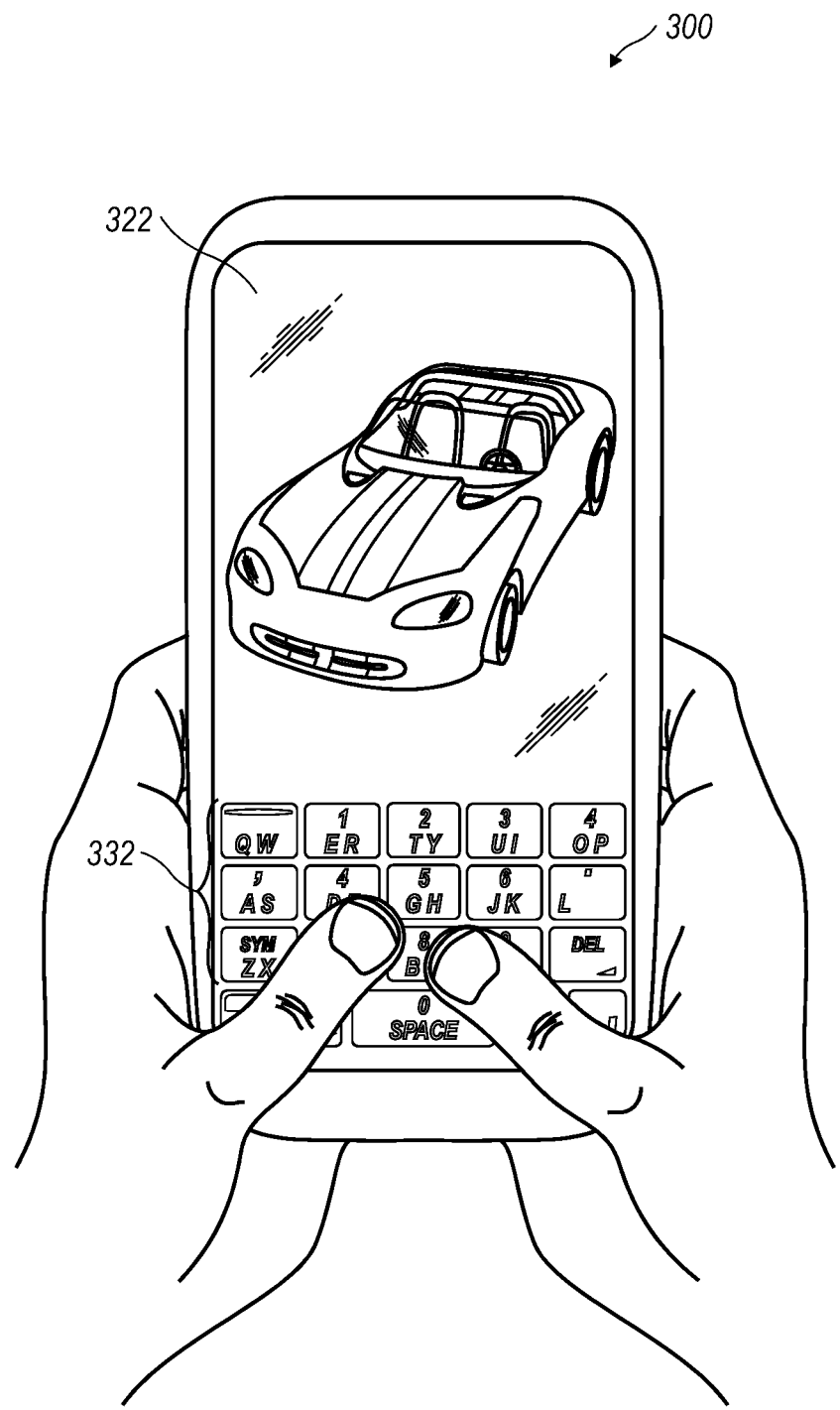
FIG. 7 is another exemplary device having a touch display on which the method for detecting and recovering from stuck keys on an electronic device keyboard can be implemented in accordance with an exemplary embodiment.

FIG. 1 is an exemplary device having a depressible keyboard 332 on which the method for detecting and recovering from stuck keys on an electronic device keyboard can be implemented in accordance with an exemplary embodiment. A communication device 300 is illustrated including a body housing a display screen 322, a microprocessor module (not pictured), and a keyboard 332 comprising a keyfield having alphanumeric keys arranged in a keyboard layout, numeric keys, and other function keys. While in the illustrated embodiment the communication device 300 is a handheld wireless communication device, in other embodiments, the communication device 300 can comprise a personal digital assistant (PDA), handheld electronic devices, wireless communication devices, pagers, cellular phones, cellular smartphones, wireless organizers wirelessly enabled notebook computers and the like. While the illustrated embodiment of FIG. 1 depicts a keyboard 332 having depressible alphanumeric, numeric, and function keys, the keyboard 332 can be displayed on a dynamic touch display comprising a display screen 322 and a touch location sensor, as illustrated in FIG. 7.

Figure 2:
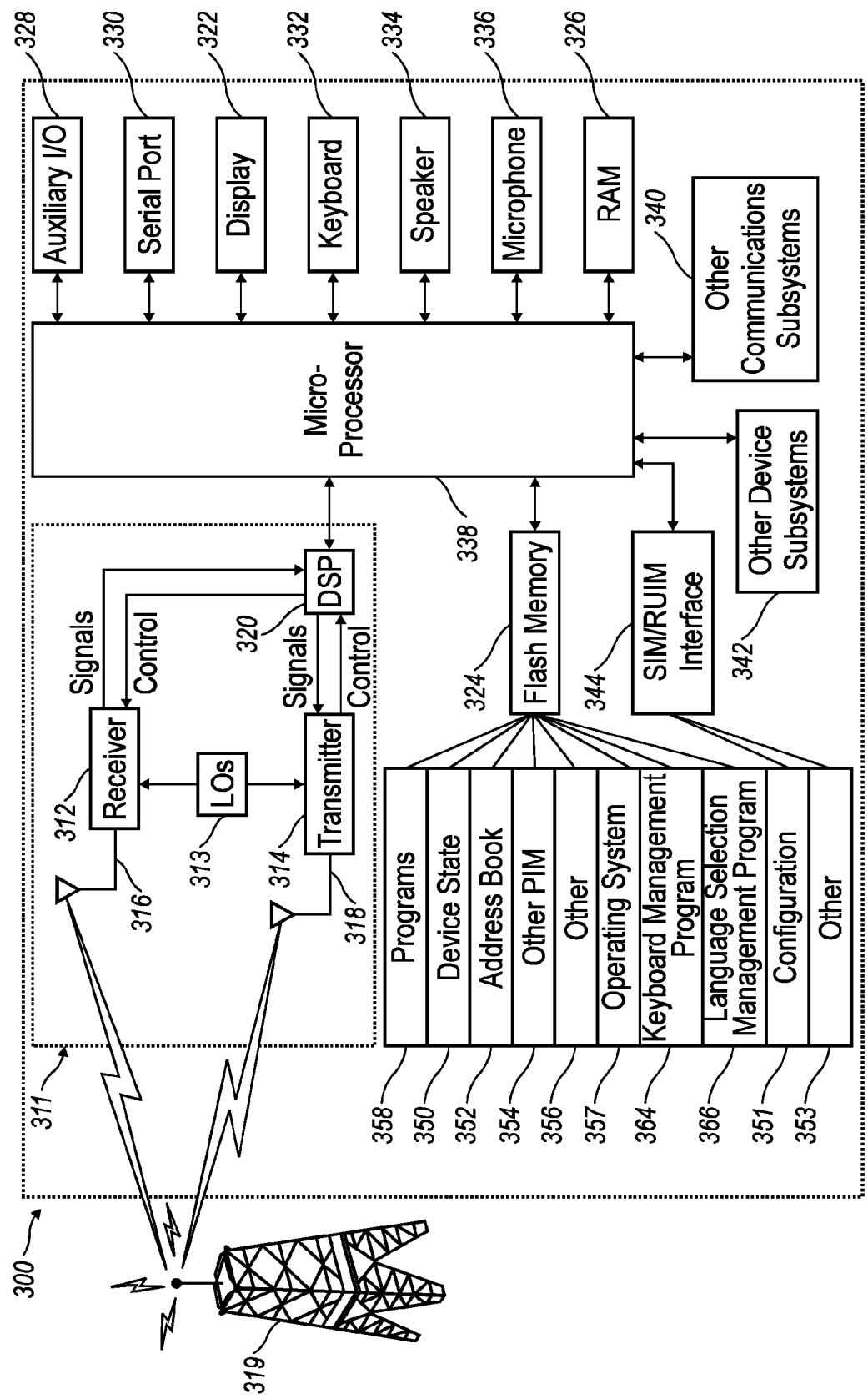
FIG. 2 is a block diagram representing a communication device interacting in a communication network in accordance with an exemplary embodiment.

As shown in the block diagram of FIG. 2, the communication device 300 includes a microprocessor module 338 that controls the operation of the communication device 300. A communication subsystem 311 performs all communication transmission and reception with the wireless network 319. The microprocessor module 338 further can be connected with an auxiliary input/output (I/O) subsystem 328 which can be connected to the communication device 300. In at least one embodiment, the microprocessor module 338 can be connected to a serial port (for example, a Universal Serial Bus port) 330 which can allow for communication with other devices or systems. A display 322 can be connected to the microprocessor module 338 to allow for displaying of information to an operator of the communication device 300. When the communication device 300 is equipped with a keyboard 332, the keyboard 332 can also be connected with the microprocessor module 338. In the presently described embodiment, a keyboard controller 380 is in communication with the microprocessor 338 in order to send or relay messages corresponding to key pressings of the keyboard 332 to the microprocessor 338. The communication device 300 can include a speaker 334, a microphone 336, random access memory (RAM) 326, and flash memory 324, all of which can be connected to the microprocessor module 338. Other similar components can be provided on the device 300 as well and optionally connected to the microprocessor module 338. Other communication subsystems 340 and other communication device subsystems 342 are generally indicated as being functionally connected with the microprocessor module 338 as well. An example of a communication subsystem 340 is that of a short range communication system such as BLUE-TOOTH® communication module or a WI-FI® communication module (a communication module in compliance with IEEE 802.11 set of protocols) and associated circuits and components. The microprocessor module 338 is able to perform operating system functions and enables execution of programs on the communication device 300. In some embodiments not all of the above components can be included in the communication device 300. For example, in at least one embodiment the keyboard 332 is not provided as a separate component, and is displayed as required on a dynamic touch display. In an embodiment having a dynamic touch display, the keyboard 332 can be displayed as a touchscreen keyboard. A touchscreen module can be incorporated in such an embodiment such that it is in communication with the microprocessor 338. When inputs are received on the touchscreen keyboard, the touchscreen module can send or relay messages corresponding to those inputs to the microprocessor 338.

The auxiliary I/O subsystem 328 can take the form of a trackball navigation tool 321 as illustrated in the exemplary embodiment shown in FIG. 1, or a thumbwheel, a navigation pad, a joystick, touch-sensitive interface, or other I/O interface. These input keys 321 can be located on the front surface of the communication device 300 or can be located on any exterior surface of the communication device 300. Other auxiliary I/O subsystems can include external display devices and externally connected keyboards (not shown). While the above examples have been provided in relation to the auxiliary I/O subsystem 328, other subsystems capable of providing input or receiving output from the communication device 300 are considered within the scope of this disclosure. Other keys can be placed along the side of the communication device 300 to function as escape keys, volume control keys, scrolling keys, power switches, or user programmable keys, and can likewise be programmed accordingly.

Furthermore, the communication device 300 is equipped with components to enable operation of various programs, as shown in FIG. 2. In an exemplary embodiment, the flash memory 324 is enabled to provide a storage location for the operating system 357, device programs 358, and data. The operating system 357 is generally configured to manage other programs 358 that are also stored in memory 324 and executable on the processor 338. The operating system 357 honors requests for services made by programs 358 through predefined program 358 interfaces. More specifically, the operating system 357 typically determines the order in which multiple programs 358 are executed on the processor 338 and the execution time allotted for each program 358, manages the sharing of memory 324 among multiple programs 358, handles input and output to and from other device subsystems 342, and so on. In addition, operators can typically interact directly with the operating system 357 through a user interface which can include the keyboard 332 and display screen 322. While in an exemplary embodiment the operating system 357 is stored in flash memory 324, the operating system 357 in other embodiments is stored in read-only memory (ROM) or similar storage element (not shown). As those skilled in the art will appreciate, the operating system 357, device program 358 or parts thereof can be loaded in RAM 326 or other volatile memory.

In one exemplary embodiment, the flash memory 324 contains programs 358 for execution on the communication device 300 including an address book 352, a personal information manager (PIM) 354, and the device state 350. Furthermore, programs 358 and other information 356 including data can be segregated upon storage in the flash memory 324 of the communication device 300.

When the communication device 300 is enabled for two-way communication within the wireless communication network 319, it can send and receive messages from a mobile communication service. Examples of communication systems enabled for two-way communication include, but are not limited to, the General Packet Radio Service (GPRS) network, the Universal Mobile Telecommunication Service (UMTS) network, the Enhanced Data for Global Evolution (EDGE) network, the Code Division Multiple Access (CDMA) network, High-Speed Packet Access (HSPA) networks, Universal Mobile Telecommunication Service Time Division Duplexing (UMTS-TDD), Ultra Mobile Broadband (UMB) networks, Worldwide Interoperability for Microwave Access (WiMAX), and other networks that can be used for data and voice, or just data or voice. For the systems listed above, the communication device 300 can require a unique identifier to enable the communication device 300 to transmit and receive messages from the communication network 319. Other systems may not require such identifying information. GPRS, UMTS, and EDGE use a Subscriber Identity Module (SIM) in order to allow communication with the communication network 319. Likewise, most CDMA systems use a Removable User Identity Module (RUIM) in order to communicate with the CDMA network. The RUIM and SIM card can be used in multiple different communication devices 300. The communication device 300 can be able to operate some features without a SIM/RUIM card, but it will not be able to communicate with the network 319. A SIM/RUIM interface 344 located within the communication device 300 allows for removal or insertion of a SIM/RUIM card (not shown). The SIM/RUIM card features memory and holds key configurations 351, and other information 353 such as identification and subscriber related information. With a properly enabled communication device 300, two-way communication between the communication device 300 and communication network 319 is possible.

If the communication device 300 is enabled as described above or the communication network 319 does not require such enablement, the two-way communication enabled communication device 300 is able to both transmit and receive information from the communication network 319. The transfer of communication can be from the communication device 300 or to the communication device 300. In order to communicate with the communication network 319, the communication device 300 in the presently described exemplary embodiment is equipped with an integral or internal antenna 318 for transmitting messages to the communication network 319. Likewise the communication device 300 in the presently described exemplary embodiment is equipped with another antenna 316 for receiving communication from the communication network 319. These antennae (316, 318) in another exemplary embodiment are combined into a single antenna (not shown). As one skilled in the art would appreciate, the antenna or antennae (316, 318) in another embodiment are externally mounted on the communication device 300.

When equipped for two-way communication, the communication device 300 features a communication subsystem 311. As is understood in the art, this communication subsystem 311 is modified so that it can support the operational needs of the communication device 300. The subsystem 311 includes a transmitter 314 and receiver 312 including the associated antenna or antennae (316, 318) as described above, local oscillators (LOs) 313, and a processing module 320 which in the presently described exemplary embodiment is a digital signal processor (DSP) 320.

It is contemplated that communication by the communication device 300 with the wireless network 319 can be any type of communication that both the wireless network 319 and communication device 300 are enabled to transmit, receive and process. In general, these can be classified as voice and data. Voice communication generally refers to communication in which messages for audible sounds are transmitted by the communication device 300 through the communication network 319. Data generally refers to all other types of communication that the communication device 300 is capable of performing within the constraints of the wireless network 319.

Example device programs that can depend on such data include email, contacts and calendars. For each such program, synchronization with home-based versions of the programs can be desirable for either or both of their long term and short term utility. As an example, emails are often time sensitive, so substantially real time synchronization can be desired. Contacts, on the other hand, can be usually updated less frequently without inconvenience. Therefore, the utility of the communication device 300 is enhanced when connectable within a communication system, and when connectable on a wireless basis in a network 319 in which voice, text messaging, and other data transfer are accommodated.

The system for detecting and recovering from stuck keys can take the form of an entirely hardware embodiment, an entirely software embodiment or an embodiment containing both hardware and software elements. In one embodiment, the system is implemented in software, which includes but is not limited to firmware, resident software, microcode, etc. Furthermore, the system can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium (though propagation mediums in and of themselves as signal carriers are not included in the definition of physical computer-readable medium). Examples of a physical computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD. Both processors and program code for implementing each as aspect of the system can be centralized or distributed (or a combination thereof) as known to those skilled in the art.

A data processing system suitable for storing program code and for executing program code will include at least one processor coupled directly or indirectly to memory elements through a system bus. The memory elements can include local memory employed during actual execution of the program code, bulk storage, and cache memories that provide temporary storage of at least some program code in order to reduce the number of times code must be retrieved from bulk storage during execution. Input/output or I/O devices (including but not limited to keyboards, displays, pointing devices, etc.) can be coupled to the system either directly or through intervening I/O controllers.

The following figures describe the method of detecting and recovering from a stuck key on a depressible keyboard 332. However, one of ordinary skill in the art will appreciate that a stuck key can be detected on a touch display keyboard, a capacitive keyboard, or other similar keyboard. For example, a key of a touch display or touchscreen keyboard 332, as illustrated in FIG. 7, can become stuck if electronic circuitry continuously generates messages corresponding to a particular key even if that particular key is not actuated or engaged. A key of a capacitive keyboard can become stuck in a similar manner. For example, a key on a capacitive keyboard can become stuck, if the keyboard 332 or device 300 continues to generate messages corresponding to an actuated key even though the key is no longer being capacitively engaged. Therefore, a stuck key can be a virtual key or a capacitive key and is not limited to a physical key that is physically stuck or unintentionally continuously depressed. While the majority of the remaining description is presented in relation to physical keys, it equally applies to touch sensitive displays, capacitive keys, or other types of input tools that are scanned for actuations, engagements or inputs. In order to simplify the description, the description refers to pressings of keys.

Figure 3:
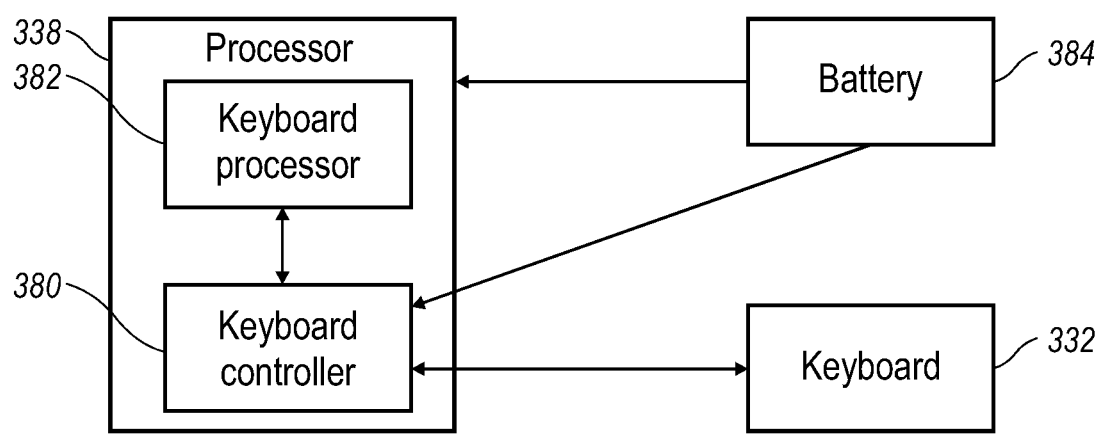
FIG. 3 is a block diagram illustrating the communication between an electronic device keyboard and a processor configured to detect and recover from stuck keys on the electronic device keyboard in accordance with an exemplary embodiment.

FIG. 3 is a block diagram illustrating the communication between a keyboard 332, a processor 338, and a battery 384 of an electronic device 300 (not pictured). In the illustrated exemplary embodiment, the processor 338 can have two components: a keyboard processor 382 and a keyboard controller 380. The battery 384 can be operatively coupled to the processor 338 and the keyboard controller 380 to deliver power to each. The keyboard processor 382 and keyboard controller 380 can be configured to be in communication with each other. The keyboard controller 380 can be configured to be in communication with the keyboard 332. In at least one embodiment, the keyboard controller 380 can control the operation of the keyboard 332. For example, the keyboard controller 380 can scan the keyboard 332 for engaged or pressed keys and can generate messages corresponding to the engaged or pressed keys of the keyboard 332. The keyboard processor 382 can monitor the processing of signals generated by the keyboard controller 380. For example, the keyboard processor 382 can monitor the keyboard controller's 380 scans and generated messages corresponding to key pressings of keys of the keyboard 332 on a periodic basis and can make determinations such as whether keys are being pressed down or whether all the keys of the keyboard 332 are in a released state, as well as other determinations. In another example, the keyboard controller 380, such as a keyboard driver, configures the keyboard hardware, and the keyboard processor 382 handles the logical aspects of key pressings and key releases of the keyboard 332. While the illustrated embodiment shows the processor 338 having two separate components, the keyboard processor 382 and the keyboard controller 380 can be integrated into one component. In alternative embodiments, the keyboard controller 380 can be a separate component from the processor 338.

Figure 4:
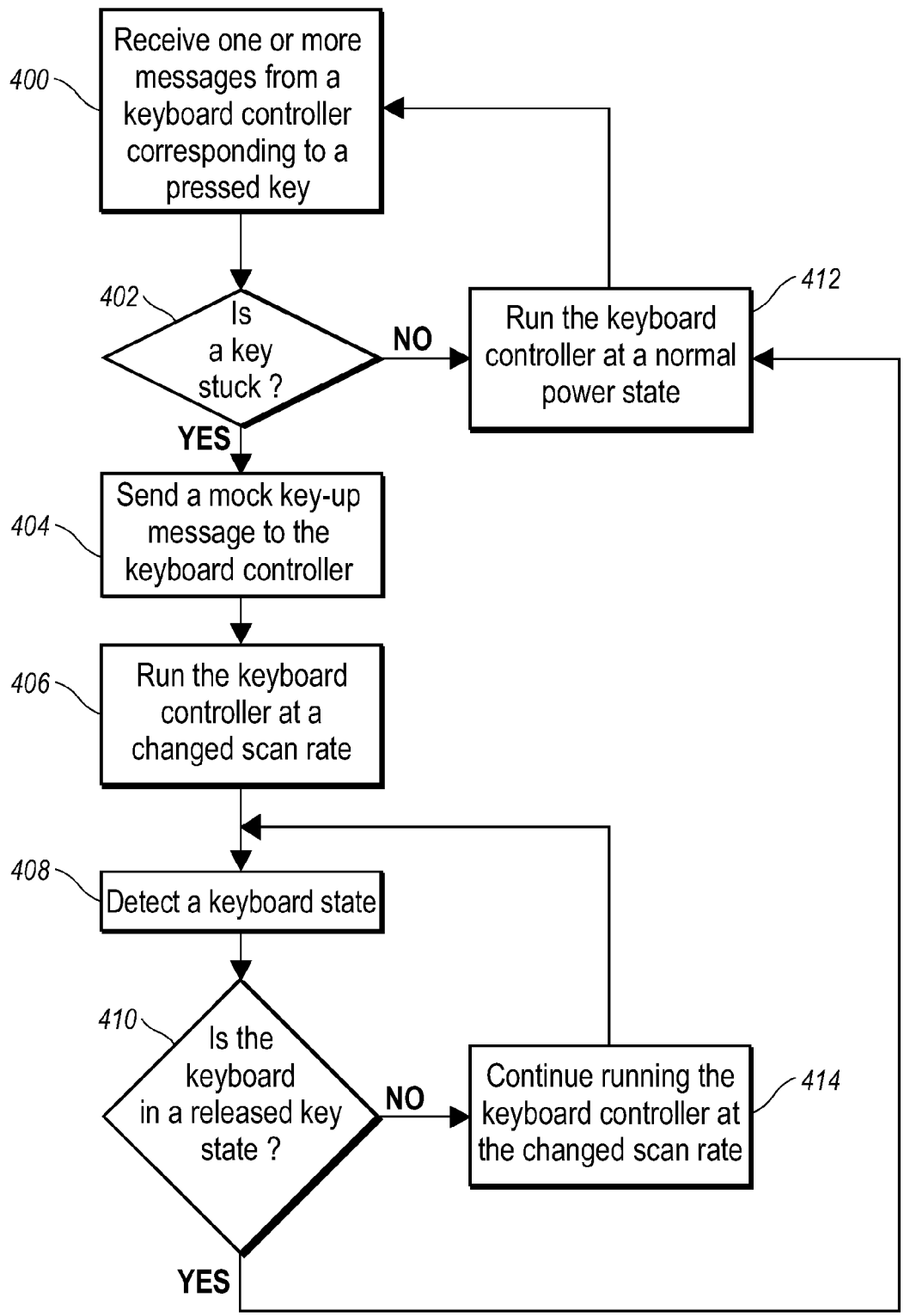
FIG. 4 is a flow chart illustrating an exemplary method of detecting and recovering from stuck keys on an electronic device keyboard.
Figure 5:
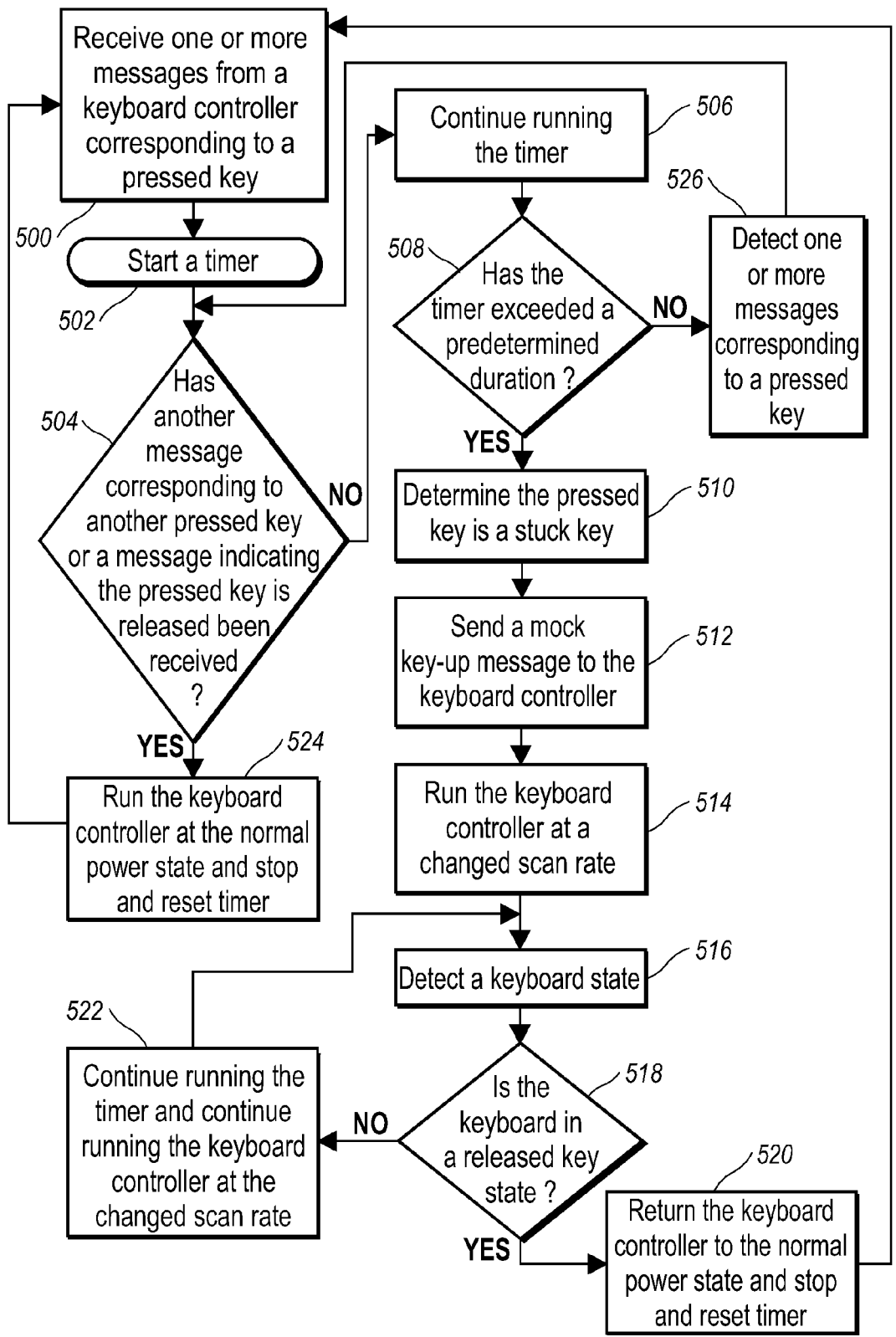
FIG. 5 is a flow chart illustrating another exemplary method of detecting and recovering from stuck keys on an electronic device keyboard including a timer.

FIGS. 4 and 5 are flow charts illustrating exemplary methods of detecting and recovering from a stuck key on an electronic device keyboard 332. For exemplary purposes, FIGS. 4 and 5 are described in relation to the processor 338 having two components illustrated in FIG. 3. The processor 338 can be configured to receive one or more messages corresponding to a pressed key based upon a predetermined periodic scan rate. In one example, the predetermined periodic scan rate can be one scan per ten milliseconds. Thus, with a predetermined periodic scan rate of one scan per ten milliseconds, the processor 338 scans for pressed keys every ten milliseconds, and each time a key of the keyboard 332 is pressed, a message is sent to the processor 338 indicating a key has been pressed. The processor 338 can also be configured to determine whether a pressed key is stuck. Exemplary methods of detecting and determining whether a pressed key is a stuck key are described below. The detection of a stuck key allows for power savings as any component of the device 300, such as the display for example, can enter a reduced power state if the appropriate determinations as described below can be made. Although the below exemplary methods are described in relation to a single processor 338, one of ordinary skill in the art will appreciate that a plurality of processors can be utilized to detect and recover from a stuck key of a keyboard 332.

Referring to FIG. 4, a flow chart of a method and associated comments for detecting and recovering from a stuck key in accordance with an exemplary embodiment is illustrated. The exemplary method is provided by way of example, as there are a variety of ways to carry out the method. In one or more embodiments, the method is performed by the processor 338 and the keyboard controller 380. The method can be executed or otherwise performed by one or a combination of various systems. The method described below can be carried out using the device 300 and communication network shown in FIGS. 1 and 2 by way of example, and various elements of these figures are referenced in explaining the exemplary method. Each block shown in FIG. 4 represents one or more processes, methods or subroutines carried out in the exemplary method. In one embodiment, the exemplary method begins at block 400 where one or more messages are received from the keyboard controller 380 and wherein each message corresponds to a pressed key of the keyboard 332. For example, at block 400, the processor 338 can receive the one or more messages from the keyboard controller 380 and can read the received message. Alternatively, the processor 338 can input the received messages from the keyboard controller 380.

At block 402 a determination that a pressed key is a stuck key is made. For example, the processor 338 can determine whether the received message or messages from the keyboard 332 indicate one or more of the pressed keys is a stuck key. If no stuck key is determined at block 402, the keyboard controller 380 operates at a normal power state at block 412. For example, the keyboard controller 380 can operate at a normal power state when it generates and sends messages corresponding to key pressings of the keyboard 332 to the processor 338 based upon a predetermined periodic rate. The processor 338 can continue to receive and process messages from the keyboard controller 380 at the normal power state until a stuck key is detected. For example, a pressed key is determined a stuck key when a continuously generated message for the same key occurs for a duration longer than a predetermined time. FIG. 5 illustrates an exemplary method of using a timer to determine whether a stuck key is detected. In the alternative, when two or more keys of the keyboard 332 are pressed simultaneously multiple times, the key that generates a message in each of the groupings of multiple key pressings can be considered stuck. One of ordinary skill in the art will appreciate, however, that other methods for detecting a stuck key can be implemented.

At block 404, a mock key-up message can be sent to the keyboard controller 380 in response to the determination of the existence of a stuck key. For example, at block 404, the keyboard processor 382 can send the mock key-up message to the keyboard controller 380. The mock key-up message can interrupt the processor 338 from inputting messages that were sent and generated by the keyboard controller 380 corresponding to the pressed key or keys of the keyboard 332. By sending a mock key-up message, the processor 338 can continue to process messages different from the message corresponding to the pressed key that is stuck. Because the keyboard controller 380 generates messages corresponding to pressed keys of the keyboard 332 and sends those messages to the processor 338 for processing and input, the processor 338 is prevented from having to repeatedly process an unintentional message from the stuck key when the mock key-up message is sent. This thereby prevents the unintentional messages of the stuck key from occupying an inordinate amount of processor capability. For examples, if a mock key-up message is sent, the processor 338 can ignore messages corresponding to pressed keys but can still process messages from other components of the device and other device modules, such as from a trackball, an email program, a display module, or other devices and modules. In one example, the processor 338 discontinues receiving and processing messages from the keyboard controller 380 corresponding to the stuck key. In alternative embodiments, an API, a hardware driver, or a keyboard driver can send the mock key-up message to the keyboard controller 380 such that no message is transmitted to the processor 338 indicating that the stuck key is actuated or pressed.

At block 406, the keyboard controller 380 operates at a changed scan rate in response to the mock key-up message. When the keyboard controller 380 operates at a changed scan rate, the keyboard controller 380 scans for pressed keys at a periodic scan rate different from the first predetermined periodic scan rate. For example, when the keyboard controller 380 operates at a changed scan rate, the keyboard controller 380 can operate in an ignore mode or a stop-scanning mode. Alternatively, the keyboard controller 380 can operate at an increased scan rate or can operate at another similar lower power mode. Operating the keyboard controller 380 at the changed scan rate reduces battery power consumption and increases the battery life of the device 300. Thus, when the keyboard controller 380 operates at the changed scan rate, the device 300 operates at a lower power state as compared to the normal power state when keyboard controller 380 is operated at a predetermined periodic scan rate.

At block 408, when the keyboard controller 380 operates at a changed scan rate, the state of the keyboard 332 can be detected. For example, the processor 338 can detect and process the state of the keyboard 332. At block 410, the device 300 can determine whether the keyboard 332 is in a released key state. The released key state informs the keyboard controller 380 and the processor 338 that all the keys of the keyboard 332 are released and there is no longer a stuck key. For example, the processor 338 can determine whether the detected state of the keyboard 332 is in a released key state at block 410. Alternatively, the keyboard processor 382 can determine whether the keyboard 332 is in a released key state. If for example, when the keyboard processor 382 detects no change in the state of the keyboard 332, the keyboard processor 382 determines that the keyboard 332 is in a released key state. Alternatively, when the keyboard processor 382 senses that all the keys of the keyboard 332 have been released, the keyboard processor 382 determines that the keyboard 332 is in a released key state.

At block 410, if a released key state is detected for the electronic device keyboard 332, the keyboard controller 380 can return to a normal power state at block 412. For example, the keyboard controller 380 can operate at a normal power state when the keypad controller 380 operates at the predetermined periodic scan rate. At block 410, if a released key state is not detected 406 for the electronic device keyboard 332, the keyboard controller 380 can continue to operate at the changed scan rate of block 414 using the changed scan rate set at block 406. The keyboard controller 380 continues to operate at the changed scan rate until a released key state is detected at block 408. As a result of operating at a changed scan rate, the device 300 operates at a lower power mode. This reduction of power increases the battery life of the device 300.

Referring to FIG. 5, a flow chart of a method and associated comments for detecting and recovering from a stuck key in accordance with an exemplary embodiment is illustrated. The exemplary method is provided by way of example, as there as there are a variety of ways to carry out the method. In one or more embodiments, the method is performed by the processor 338 and the keyboard controller 380. The method can be executed or otherwise performed by one or a combination of various systems. The method described below can be carried out using the communication device and communication network shown in FIGS. 1 and 2 by way of example, and various elements of these figures are referenced in explaining exemplary method. Each block shown in FIG. 5 represents one or more processes, methods or subroutines carried out in exemplary method. The exemplary embodiment depicted in FIG. 5 comprises a timer and can begin at block 500, where a message corresponding to a pressed key of the keyboard 332 is received. For example, the processor 338 can receive the one or more messages from the keyboard controller 380, wherein each message corresponds to a pressed key of the keyboard 332.

At block 502, a timer can start in response to the detection of a pressed key or a key actuation. At block 504, the device 300 can determine whether another message corresponding to a pressed key has been received. For example, the processor 338 can make the determination at block 504. At block 524, if another message corresponding to another pressed key or message indicating the pressed key is released has been received, the timer can be stopped and reset. When the timer is stopped and reset, the processor 338 can continue to receive and process or input the messages corresponding to pressed keys.

At block 506, the timer continues to run and is compared to a predetermined duration unless another message corresponding to another pressed key is received or a message indicating the pressed key is released is received. At block 508, the device 300 determines whether the timer has exceeded the predetermined duration. For example, the processor 338 can make the determination at block 508. The predetermined duration can be set to forty-five seconds, one minute, ninety seconds, two minutes, five minutes, or any other predetermined value. At block 526, if a determination has been made that the timer has not exceeded the predetermined duration, the device 300 can continue to detect messages corresponding to pressed keys of the keyboard 332. The timer stops and is reset when the device 300 detects a message corresponding to another pressed key of the keyboard 332. The processor 338 for example can perform the detection at block 526 until another key of the keyboard 332 has been pressed.

At block 510, if the device 300 determines the timer has exceeded the predetermined duration, the device 300 can determine a pressed key is a stuck key. At block 512, a mock key-up message can be sent to the keyboard controller 380 in response to the existence of a stuck key. For example, the processor 338 can send the mock key-up message to the keyboard controller 380 at block 512. The mock key-up message can interrupt the processor 338 from inputting the messages generated in response to the pressed key or keys of the keyboard 332. By sending a mock key-up message, the processor 338 can continue to process messages different from the message corresponding to the pressed key that is stuck. In one example, by sending a mock key-up message, the processor 338 is prevented from having to repeatedly process the unintentional messages from the stuck key, thereby preventing the unintentional messages of the stuck key from occupying an inordinate amount of processor capability.

At block 514, in response to the mock key-up message sent in block 512, the keyboard controller 380 can operate at a changed scan rate. When the keyboard controller 380 operates at a changed scan rate, the keyboard controller 400 can scan for pressed keys at a periodic rate different from the first predetermined periodic scan rate, can operate in an ignore mode, can operate in a stop-scanning mode, or can enter another lower power state.

At block 516, when the keyboard controller 380 operates at a changed scan rate, the device can detect the state of the keyboard 332. For example, the processor 338 can detect and process the state of the keyboard 332 at block 516. At block 518, the device can process the keyboard state and can make a determination of whether the keyboard 332 is in a released state is made. The processor 338 can process and determine the state of the keyboard 332, for example. Alternatively, the keyboard processor 382 can determine whether the keyboard 332 is in a released key state. The released key state informs the keyboard controller 380 and the processor 338 that all the keys of the keyboard 332 are released and there is no longer a stuck key. For example, when the keyboard processor 382 detects no change in the state of the keyboard 332, the keyboard processor 382 can determine that the keyboard 332 is in a released key state. Alternatively, when the keyboard processor 382 of the processor 338 senses that all the keys of the keyboard 332 have been released, the keyboard processor 382 can determine that the keyboard 332 is in a released key state.

At block 520, if a released key state is detected, the keyboard controller 380 can return to the normal power state, where messages corresponding to pressed keys of the keyboard 332 are generated by the keyboard controller 380 and received by the processor 338 based upon a predetermined periodic scan rate. At block 522, if a released key state is not detected, the keyboard controller 380 can continue to operate at the changed scan rate of block 514 until a released key state is detected at block 516.

In an alternative embodiment, the keyboard controller 380 can operate at a changed scan rate, for example at block 406 of FIG. 4 or at block 514 of FIG. 5, by entering an ignore mode. In an ignore mode, the processor 338 can ignore the one or more messages generated by the keyboard controller 380 when a key of the keyboard 332 is pressed or engaged, thereby preventing further input from the keyboard 332 by the processor 338. In the ignore mode, no new messages, phone numbers, functions, or other inputs can be entered at the keyboard 332. Because the processor 338 does not receive messages from the keyboard controller 380, less power is being consumed to scan for or to process key pressings of the keyboard 332. Although the processor 338 ignores messages generated by the keyboard controller 380, the processor 338 can still receive and process messages from other components, devices, or modules, such as input messages from a trackball, signals from an email program, inputs to answer phone calls, or other similar messages. When the processor 338 determines and detects a released key state of the keyboard 332, the keyboard controller 380 returns to the normal power state. In this example, the keyboard controller 380 and device 300 return to the normal power state by exiting the ignore mode and permitting the processor 338 to receive and process the one or more messages corresponding to pressed keys of the keyboard 332 at the predetermined periodic scan rate.

In another alternative embodiment, the keyboard controller 380 can operate at a changed scan rate by operating the keyboard controller 380 in a stop-scanning mode. In the stop-scanning mode, the keyboard controller 380 stops scanning for pressed keys and does not send messages to the processor 338 corresponding to pressed keys of the keyboard 332. As a result, the processor 338 does not receive, process, or input any messages corresponding to pressed keys of the keyboard 332. Thus, no new messages, phone numbers, functions, or other inputs can be inputted by the processor 338. By operating the keyboard controller 380 in a stop-scanning mode, the device 300 enters a lower power state and conserves battery power. Because the processor 338 does not receive messages from the keyboard controller 380 and because the keyboard controller 380 is in a stop-scanning mode, less power is consumed. Even more, since the device 300 is not scanning for pressed keys or processing messages corresponding to pressed keys, the device 300 is consuming less battery power. When the processor 338 determines and detects a released key state of the keyboard 332, the keyboard controller 380 returns to the normal power state. If the keyboard controller 380 entered a stop-scanning mode, returning the keyboard controller 380 to a normal state comprises exiting the stop-scanning mode so that the keyboard controller 380 can resume scanning for pressed keys of the keyboard 332 and can resume sending messages corresponding to the pressed keys to the processor 338.

In another exemplary embodiment, operating the keyboard controller 380 at a changed scan rate can comprise changing the predetermined periodic scan rate to an increased scan. Such an increased scan rate can be one scan per one second, one scan per one and half seconds, one scan per five seconds, or any other scan rate. By increasing the scan rate, the processor 338 increases the time between successive scans, which thereby reduces the processor's 338 reaction time of inputting and processing messages corresponding to a key pressing of the keyboard 332. For example, if the keyboard controller 380 operates at a normal scan rate of one scan per ten milliseconds and if no stuck key has been detected, when a key corresponding to the letter "b" is pressed, the processor 338 inputs the letter "b" almost instantaneously. Contrastingly, if a stuck key has been detected and if the keyboard controller 380 operates at a changed scan rate of one scan per one second, when a key corresponding to the letter "b" is pressed, the processor 338 inputs the letter "b" ten times slower than it would have had the keyboard controller 380 been scanning for pressed keys every ten milliseconds.

By scanning for pressed keys at an increased scan rate, the electronic device 300 and processor 338 operates at a lower power state as less battery power is needed to scan for pressed keys. Less power is needed to scan for pressed keys because the processor 338 is scanning for keys less often. For example, when the keyboard controller 380 operates at an increased scan rate of one scan per one second, the processor 338 and device 300 draw power from the battery 384 once every second to scan for pressed, engaged, or actuated keys of the keyboard 332, rather than drawing power once every ten milliseconds, for example as in a first predetermined scan rate of the normal power state. In this alternative embodiment, when the changed scan rate increases the scan rate, keys of the keyboard 332 can still be pressed, and the processor 338 can still receive and input the messages corresponding to the pressed keys. The processor 338 just inputs the messages at a slower rate than it would have had the keyboard controller 380 been operated at a normal power state. For example, the keyboard controller 380 operates at a normal power state when it operates at the predetermined periodic scan rate. When the processor 338 determines a detected released key state, the keyboard controller 380 can return to a normal power state.

Figure 6:
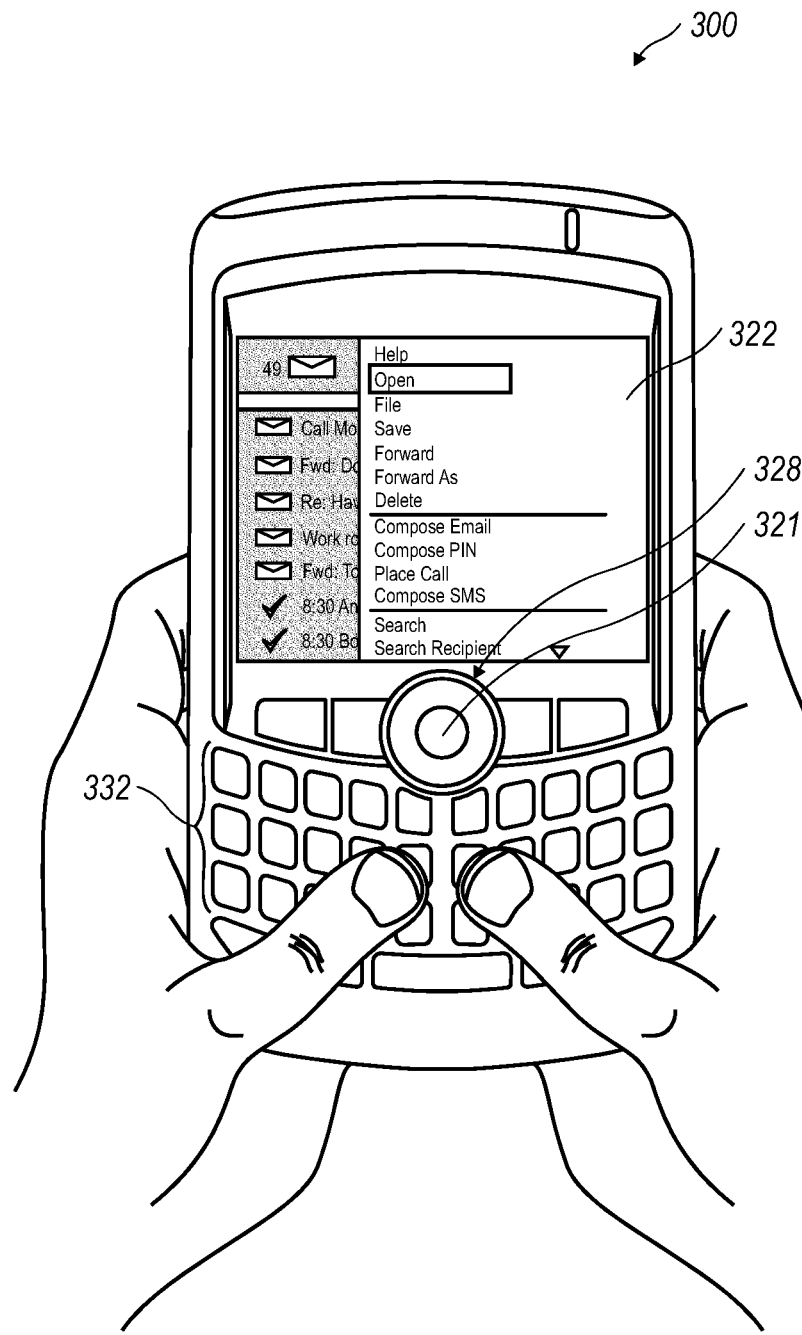
FIG. 6 is an exemplary device on which the method for detecting and recovering from stuck keys on an electronic device keyboard can be implemented in accordance with an exemplary embodiment.

FIG. 6 is an illustration of a handheld communication device 300 having a keyboard 332 on which keys can become stuck and on which a processor 338 can be configured to detect and recover from a stuck key on the keyboard 332. FIG. 7 is an illustration of another exemplary handheld communication device 300 having a touchscreen keyboard on which keys can become stuck and on which a processor 338 can be configured to detect and recover from a stuck key on the keyboard 332.

Although the above-described method has been described in relation to scanning for pressings or actuations of keys of a keyboard, one of ordinary skill in the art will appreciate that the method can be implemented to scan, detect, and recover from any type of stuck key or actuable icon or item on an electronic device. For example, on a touchscreen or touch display device, scans can be made for actuations of icons, keys, or items separate from a keyboard. An application on a touchscreen device can display icons, buttons, or function keys that can be actuated to enter inputs to or initiate functions on the device. These icons, buttons, or function keys can become stuck, and the method described above can be implemented to determine and recover from such a stuck icon, button, or function key.

Exemplary embodiments have been described hereinabove regarding the implementation of a method for detecting and recovering from a stuck key on an electronic device keyboard on a handheld electronic device and on a device which the processor performs the method. However, one of ordinary skill in the art will appreciate that the method can be implemented on other devices, such as laptops, desktop computers, or other devices comprising a keyboard. One of ordinary skill in the art will also appreciate that the method can be performed by devices other than a processor, such as a hardware component, a hardware driver, an API, or other similar devices and components. Various modifications to and departures from the disclosed embodiments will occur to those having skill in the art. The subject matter that is intended to be within the spirit of this disclosure is set forth in the following claims.

What is claimed is:

1. A method of recovering from a stuck key on an electronic device keyboard comprising a plurality of keys, the method comprising:

receiving one or more messages at a processor, wherein said one or more messages are generated based upon a predetermined periodic scan rate and each message corresponds to a pressed key;

determining that a pressed key is a stuck key by the processor based upon the received one or more messages corresponding to a pressed key;

sending a mock key-up message from the processor to a keyboard controller in response to the determined stuck key, the mock key-up message interrupting the processor from inputting messages generated by the keyboard controller corresponding to the stuck key, thereby preventing the processor from processing messages corresponding to the stuck key, while enabling the processor to continue to process messages corresponding to the remainder of the plurality of keys;

operating the keyboard controller at a changed periodic scan rate in response to the mock key-up message, in which keyboard controller continues to scan, but at a periodic rate which is different from the predetermined periodic scan rate;

detecting the electronic device keyboard is in a released key state by the processor; and operating the keyboard controller at the predetermined periodic scan rate in response to the detected released key state.

2. The method of claim 1, further comprising starting a timer in response to receiving the one or more messages corresponding to a pressed key.

3. The method of claim 2, wherein a stuck key is determined when the timer exceeds a predetermined duration.

4. The method of claim 3, where the predetermined duration is set to at least forty-five seconds.

5. The method of claim 1, wherein operating the keyboard controller at the changed scan rate comprises changing the predetermined periodic scan rate to an increased periodic scan rate.

6. The method of claim 5, wherein the increased periodic scan rate is at least one scan per one second.

7. The method of claim 1, wherein operating the keyboard controller at a changed scan rate is operating the electronic device at a lower power state compared to a normal power state at the predetermined periodic scan rate.

8. The method of claim 1, wherein the predetermined periodic scan rate is at least one scan per ten milliseconds.

9. An electronic device comprising:
a display screen;
a keyboard comprising a plurality of keys; and
a processor in data-communication with the display screen and the keyboard and having a keyboard controller, said processor and said keyboard controller configured to:
receive one or more messages at the processor, wherein said one or more messages are generated based upon a predetermined periodic scan rate and each message corresponds to a pressed key of the keyboard;

determine that a pressed key is a stuck key by the processor based upon the received one or more messages corresponding to a pressed key;

send a mock key-up message from the processor to the keyboard controller in response to the determined stuck key, the mock key-up message interrupting the processor from inputting messages generated by the keyboard controller corresponding to the stuck key, thereby preventing the processor from processing messages corresponding to the stuck key, while enabling the processor to continue to process messages corresponding to the remainder of the plurality of keys;

operate the keyboard controller at a changed periodic scan rate in response to the mock key-up message, in which keyboard controller continues to scan, but at a periodic rate which is different from predetermined periodic scan rate;

detect the keyboard is in a released key state by the processor; and operate the keyboard controller at the predetermined periodic scan rate in response to the detected released key state.

10. The electronic device of claim 9, wherein the keyboard controller and the processor are further configured to start a timer when one or more messages corresponding to a pressed key is detected.

11. The electronic device of claim 10, wherein the keyboard controller and the processor determine that a pressed key is a stuck key when the timer has exceeded a predetermined duration.

12. The electronic device of claim 11, wherein the predetermined duration is set to at least forty-five seconds.

13. The electronic device claim of 9, wherein the keyboard controller and the processor are further configured to change the predetermined periodic scan rate to an increased periodic scan rate.

14. The electronic device of claim 9, wherein the keyboard controller and the processor are further configured to return the keyboard controller to the predetermined scan rate.

15. The electronic device of claim 9, wherein the display screen is a touch display and the keyboard is a virtual keyboard displayed on the touch display.

16. The electronic device of claim 9, wherein the processor comprises a keyboard processor and the keyboard controller.

* * * * *